United States Patent
Ruckerbauer et al.

(10) Patent No.: US 7,173,877 B2
(45) Date of Patent: Feb. 6, 2007

(54) MEMORY SYSTEM WITH TWO CLOCK LINES AND A MEMORY DEVICE

(75) Inventors: Hermann Ruckerbauer, Moos (DE); Christian Sichert, München (DE); Dominique Savignac, Ismaning (DE); Peter Gregorius, München (DE); Paul Wallner, Prien (DE)

(73) Assignee: Infineon Technologies AG, Munich (DE)

( * ) Notice: Subject to any disclaimer, the term of this patent is extended or adjusted under 35 U.S.C. 154(b) by 130 days.

(21) Appl. No.: 10/955,177

(22) Filed: Sep. 30, 2004

(65) Prior Publication Data

US 2006/0067157 A1   Mar. 30, 2006

(51) Int. Cl.
  *G11C 8/00*   (2006.01)
(52) U.S. Cl. ........... 365/233; 365/233.5; 711/167; 711/169; 710/106; 710/107; 713/400
(58) Field of Classification Search ........ 365/233, 365/233.5; 711/167, 169; 710/106, 107; 713/400
See application file for complete search history.

(56) References Cited

U.S. PATENT DOCUMENTS

| 6,029,252 A * | 2/2000 | Manning ............... 713/600 |
| 6,151,648 A * | 11/2000 | Haq .................. 710/107 |
| 6,247,138 B1 * | 6/2001 | Tamura et al. ........... 713/600 |
| 6,330,627 B1 * | 12/2001 | Toda ................. 710/104 |
| 6,442,644 B1 * | 8/2002 | Gustavson et al. ......... 711/105 |

(Continued)

FOREIGN PATENT DOCUMENTS

| JP | 410143424 A | * | 5/1998 |
| JP | 2000194594 A | * | 7/2000 |

OTHER PUBLICATIONS

Matthew Haycock and Randy Mooney, "3.2GHz 6.4Gb/s per Wire Signaling in 0.18 μm CMOS", 2001 IEEE International Solid-State Circuits Conference, pp. 62, 63 and 430.

(Continued)

*Primary Examiner*—Viet Q. Nguyen
(74) *Attorney, Agent, or Firm*—Patterson & Sheridan, L.L.P.

(57) ABSTRACT

The present invention relates to a memory system having a memory device with two clock lines. One embodiment of the present invention provides a memory system comprising at least one memory device, a memory controller to control operation of the memory device, a first clock line which extends from a write clock output of the memory controller to a clock port of the memory device to provide a clock signal to the memory device, and a second clock line which extends from the clock port of the memory device to a read clock input of the memory controller to forward the clock signal applied to the clock port of the memory device back to a read clock input of the memory controller. The memory device may further comprise a synchronization circuit adapted to receive the clock signal from the memory controller and to, provide an output data synchronized to the forwarded clock signal.

16 Claims, 2 Drawing Sheets

U.S. PATENT DOCUMENTS

| | | | |
|---|---|---|---|
| 6,449,727 B1 * | 9/2002 | Toda | 713/401 |
| 6,518,794 B2 * | 2/2003 | Coteus et al. | 326/93 |
| 6,606,277 B2 * | 8/2003 | Takahashi | 365/233 |
| 6,647,523 B2 * | 11/2003 | Manning | 714/720 |
| 6,745,271 B2 * | 6/2004 | Toda | 710/104 |
| 6,801,989 B2 * | 10/2004 | Johnson et al. | 711/167 |
| 6,836,503 B2 * | 12/2004 | Best et al. | 375/355 |
| 6,941,484 B2 * | 9/2005 | To et al. | 713/500 |
| 2002/0161968 A1 * | 10/2002 | Yoo et al. | 711/105 |
| 2006/0045227 A1 * | 3/2006 | Guan | 375/376 |
| 2006/0067156 A1 * | 3/2006 | Ruckerbauer et al. | 365/233 |

OTHER PUBLICATIONS

Joseph Kennedy et al., "A 2Gb/s Point-to-Point Heterogeneous Voltage Capable DRAM Interface for Capacity-Scalable Memory Subsystems", 2004 IEEE International Solid-State Circuits Conference, Session 11.8.

Jin-Hyun Kim et al., "A 4 Gb/s/pin 4-Level Simultaneous Bidirectional IO using a 500MHz Clock for High-Speed Memory", 2004 IEEE International Solid-State Circuits Conference, Session 13.9.

* cited by examiner

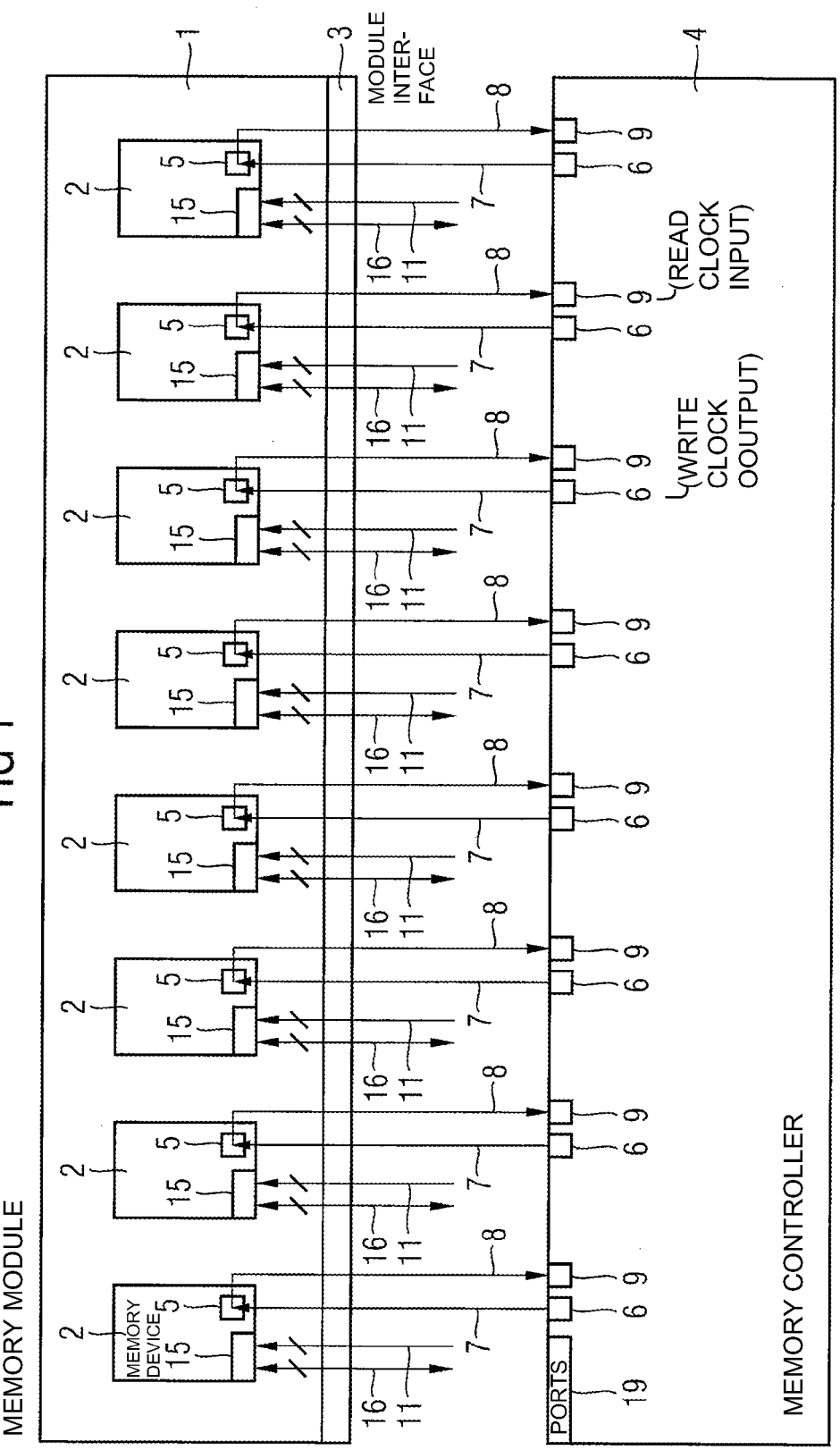

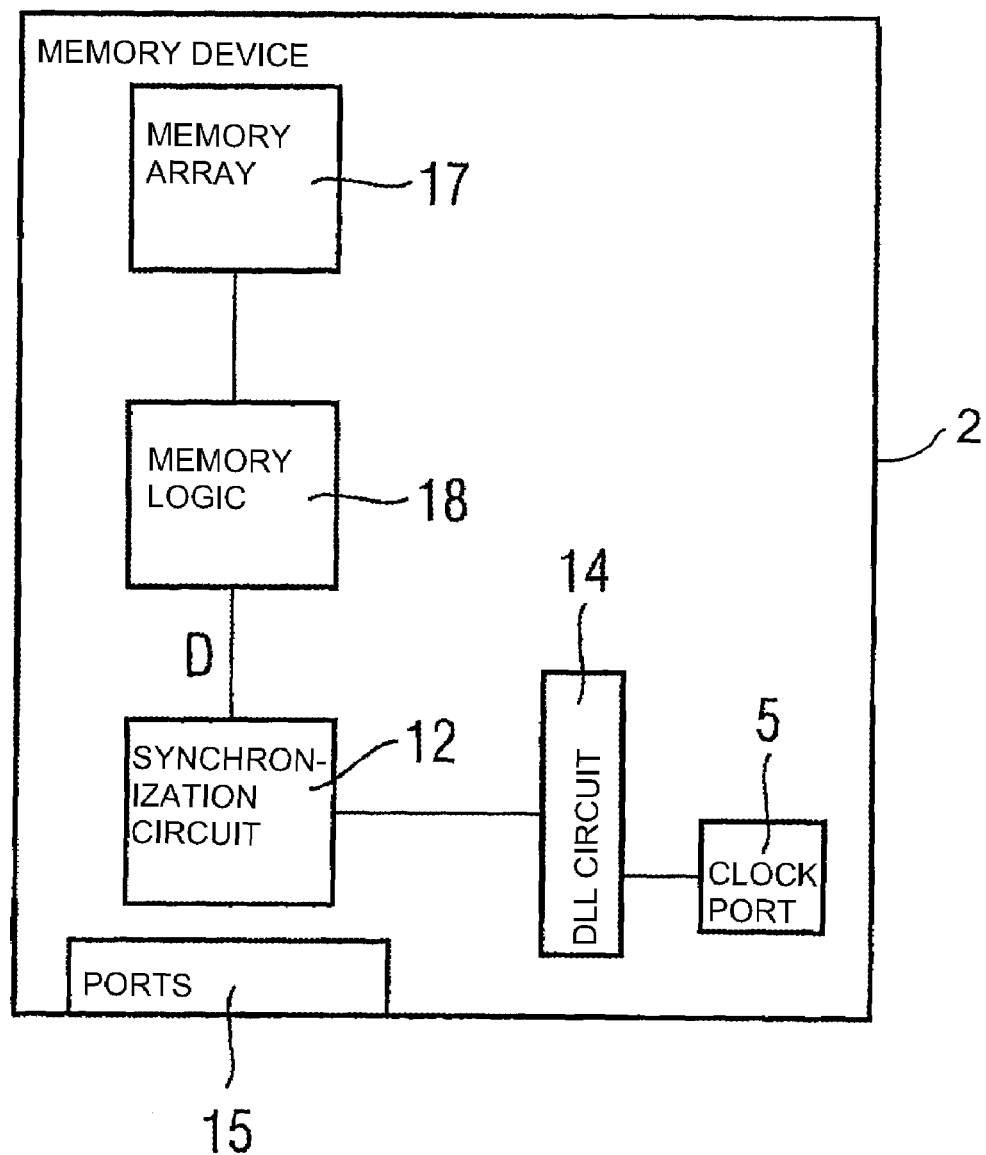

MEMORY SYSTEM WITH TWO CLOCK LINES AND A MEMORY DEVICE

BACKGROUND OF THE INVENTION

1. Field of the Invention

The present invention relates to a memory system including at least one memory device and a memory controller adapted to control operation of the memory device.

2. Description of the Related Art

In conventional DRAM memory systems for writing data into a DRAM device and for reading out data from the DRAM device, different clock signals are provided wherein the write clock is generated within the memory controller and the read clock is generated within the memory device. Usually both the write clock and the read clock are independent from each other, supplied via different clock lines and provided to different clock inputs at the memory device.

In future high-speed memory interfaces, e.g., in view of DDR-4 (Double Data Rate) the pin count for each channel of the memory device increases substantially, e.g., due to the introduction of a differential signalling. In such a memory system, the clock signals will be provided by at least three lines, e.g., one clock line for transmitting command and address signals, one write clock which is synchronized with data to be written and one read clock which is synchronized with data to be read out of the memory device. The high pin count results in an increased power consumption and renders the design of the memory system more complex.

It is therefore an aspect of the present invention to reduce the interconnection lines within a memory system and more particularly, to reduce the pin count of a memory device used in such a memory system.

SUMMARY OF THE INVENTION

The present invention relates to a memory system including at least one memory device and a memory controller adapted to control operation of the memory device. The operation may include a write and read operation according to whether data is supplied to the memory device to be written therein and data is read out of the memory device, respectively.

According to a first aspect of the present invention, a memory system is provided which includes at least one memory device and a memory controller which is adapted to control the operation of the memory device. A first clock line extends from a write clock output of the memory controller to a clock port of the memory device to provide a clock signal to the memory device. A second clock line extends from the clock port of the memory device to a read clock input of the memory controller to forward the clock signal applied to the clock port of the memory device back to a read clock input of the memory controller. In the memory device a synchronization circuit is included which is adapted to receive the write clock signal from the memory controller and to provide an output data synchronized to the write clock signal which forwarded back to the memory controller.

In such a memory system, the pin count of the memory device can be reduced because it is not necessary that the memory device provides a read clock signal separately generated and provided on a separated clock port of the memory device. Instead, the write clock provided by the memory controller is fed to the clock port of the memory device and from there fed back to the read clock input of the memory controller. Thereby, the write clock signal provided by the write clock output of the memory controller propagates via the first clock line to the clock port of the memory device and from there via the second clock line directly back to the read clock input of the memory controller. By means of the synchronization circuit in the memory device, the output data provided is synchronized to the clock signal received at the clock port of the memory device and fed back to the memory controller.

According to one embodiment of the present invention, the synchronization circuit is adapted to synchronize the output data to the clock signal received at the clock port such that the output data is output from a data output of the memory device synchronized to the received clock signal. This is especially advantageous when the output data is transferred via a data line extending between the memory device and the memory controller, wherein the data line has substantially the same length as the second clock line.

According to another embodiment of the present invention, the synchronization circuit is adapted to synchronize the output data to the clock signal such that the output data is synchronized to the redirected clock signal at the data input and the read clock input of the memory controller.

The memory device may further include a data input to receive write data depending on the received clock, wherein the data input comprises an input buffer in which the data to be written can be latched.

Furthermore, the memory system may comprise a memory module in which a number of memory devices are included, wherein, in the memory system, each memory device is independently connected via a respective first and second clock line to the memory controller.

In one embodiment, the memory system is a double data rate (DDR) memory system.

According to another aspect of the present invention, a memory device includes an output port to output data, a clock input to receive a clock signal and a synchronization circuit to synchronize the output data to be output at the output port to the received clock signal. In contrast to conventional memory devices, this memory device only uses a single clock port to receive a clock signal for receiving write data, but uses no separate read clock output to provide a read clock signal. The read clock signal, which is conventionally used to synchronize the output data so that the memory controller can receive the output data with respect to the read clock signal is not generated and provided by the memory device. Instead, in one embodiment of the present invention, the output data is synchronized to the received clock signal at the position of the clock port of the memory device, which is a reference for a read clock signal, and the output data is synchronized thereto.

BRIEF DESCRIPTION OF THE DRAWINGS

These and other aspects and features of the present invention will become clear from the following description taken in conjunction with the accompanying drawings in which:

FIG. 1 shows a memory module which is connected via clock lines to a memory controller according to one embodiment of the invention; and FIG. 2 shows a block diagram of a DRAM memory device according to another embodiment of the present invention.

DETAILED DESCRIPTION OF THE PREFERRED EMBODIMENT

In FIG. 1, a memory module 1 is depicted in which a number of memory devices 2 are arranged. Each of the memory devices 2 comprises a number of ports 15, which comprises data ports, command and address ports, etc., to provide interactions between an external system and the memory module 1. The data ports and the command and address ports are coupled to the external system via a module interface 3. The memory module 1 may be fixedly or releasably coupled to a printed circuit board of the system and thereby electrically connected to a memory controller 4 via bus lines 16 (e.g., data lines 10, command and address lines 11, etc.). The module interface 3 further provides respective bidirectional data lines 10 to provide data to and transfer data from each of the memory devices 2.

Each memory device 2 comprises a clock port 5 which is coupled with an associated write clock output 6 of the memory controller 4 by means of a first clock line 7, respectively. The clock port 5 of each memory device 2 is coupled by means of a second clock line 8 which feeds back the clock signal arrived at the clock port 5 to a read clock input 9 the memory controller 4.

When data is to be written to the memory devices 2 of the memory module 1, the memory controller 4 provides the data at the respective data output ports 19 of the memory controller 4 synchronously to a write clock at the respective write clock output 6. Given that the signalling lines (e.g., data lines, command and address lines, clock lines, etc.) between the memory controller 4 and the memory module 1 are substantially equal in length, the data to be written into the memory device 2 can be latched into input buffer (not shown) of the respective memory device by means of the clock signal which is received at the clock port 5 of the respective memory device 2. A clock signal is provided from the memory controller 4 substantially at all times so that in a case when data has to be read out of the memory devices 2, the clock signal arrives at the clock port 5 and from there propagates back via the second clock line 8 to the respective read clock input 9 of the memory controller 4.

In contrast to conventional memory devices 2 wherein data to be read out of the memory device 2 is provided synchronously to a read clock signal generated by the memory device 2, the output data is synchronized to the clock signal which has arrived at the clock port 5 of each memory device 2.

As shown in FIG. 2, the memory device 2 includes a memory array 17, a memory logic 18 and a synchronization circuit 12 which is further connected to the clock port 5. The synchronization circuit 12 receives the internal data (D) provided by the memory array 17 to be output. Depending on the clock signal at the clock port 5, the data is forwarded to the data port of ports 15 via which the output data is output to respective data lines 10 of the bus lines 16. The synchronization circuit 12 is operated in a way that data received in the synchronization circuit 12 from within the memory device 2 is latched and applied to the data port of ports 15 according to the clock signal received via the clock port 5. Depending on the propagation delay of the clock signal received at the clock port 5 to the synchronization circuit 12, a delay locked loop (DLL) circuit 14 may be provided to output the output data at the data port of ports 15 synchronously to the clock signal fed back via the second clock line 8.

In one embodiment, the propagation delay of the data signals on the data lines is substantially equal to the propagation delay of the clock signal fed back from the clock port 5 of the memory device 2 to the memory controller 4. If the second clock line 8 and the bus lines 16 are not assured to be of equal length, the DLL circuit 14 should be provided such that the synchronization circuit 12 synchronizes the data output at the data port of port 15, so that the data arrives synchronously to the fed back clock signal at the memory controller 4.

One aspect of the present invention is that no separate read and write clocks have to be provided independently, e.g., by different clock generators in a memory system. According to one embodiment of the present invention, a single clock signal is provided via a first clock line 7 to a clock port 5 of each of the memory devices 2, and the provided clock signal is used as both the write and read clock signals so that data to be output is output synchronized to the provided clock signal currently applied to the clock port 5. Thereby, the provided clock signal at the clock port 5 can be regarded as the read clock of the memory device. The difference in comparison with conventional memory systems is that the read clock has not been generated within the memory device 2, but rather is derived from the clock signal provided by the memory controller 4 via the first clock line 7 to the memory device 2. In embodiments of the invention, the pin count of the memory device is reduced so that the memory devices may be manufactured more reliably and with lower costs.

While the foregoing is directed to embodiments of the present invention, other and further embodiments of the invention may be devised without departing from the basic scope thereof, and the scope thereof is determined by the claims that follow.

What is claimed is:

1. A memory system, comprising:
   at least one memory device;
   a memory controller configured to control operation of the at least one memory device;
   a first clock line extending from a write clock output of the memory controller to a clock port of the at least one memory device to provide a clock signal to the at least one memory device;
   a second clock line extending from the clock port of the at least one memory device to a read clock input of the memory controller to forward the clock signal applied to the clock port of the memory device back to the read clock input of the memory controller; and
   a synchronization circuit, disposed in the at least one memory device, configured to receive the clock signal from the memory controller and to synchronize output data to the clock signal being forwarded back to the memory controller; wherein the synchronization circuit is configured to synchronize the output data to the received clock signal such that the output data is output from a data output of the memory device synchronized to the received clock signal.

2. The memory system of claim 1, wherein the synchronization circuit is configured to synchronize the output data to the forwarded clock signal such that the output data is synchronous to the forwarded clock signal at a data input and the read clock input of the memory controller.

3. The memory system of claim 1, further comprising:
   a plurality of data lines extending between the memory device and the memory controller for transferring output data, wherein each data line has a substantially same length as the second clock line.

4. A memory system, comprising:
   at least one memory device;
   a memory controller configured to control operation of the at least one memory device;

a first clock line extending from a write clock output of the memory controller to a clock port of the at least one memory device to provide a clock signal to the at least one memory device; and a second clock line extending from the clock port of the at least one memory device to a read clock input of the memory controller to forward the clock signal applied to the clock port of the memory device back to the read clock input of the memory controller; wherein the memory device further includes a data input to receive write data depending on the received clock signal, wherein the data input comprises an input buffer to latch in data to be written.

5. A memory system, comprising:
at least one memory device;
a memory controller configured to control operation of the at least one memory device;
a first clock line extending from a write clock output of the memory controller to a clock port of the at least one memory device to provide a clock signal to the at least one memory device; and
a second clock line extending from the clock port of the at least one memory device to a read clock input of the memory controller to forward the clock signal applied to the clock port of the memory device back to the read clock input of the memory controller; wherein the at least one memory device comprises a plurality of memory devices provided in a memory module and wherein each memory device is independently connected via a respective first and second clock lines to the memory controller.

6. The memory system of claim 1, wherein the memory system is a Double-Data-Rate (DDR) memory system.

7. A memory device, comprising:
an output port for outputting an output data;
a clock port for receiving a clock signal and forwarding the clock signal, wherein the output data is output relative to the forwarded clock signal; and
a synchronization circuit configured to synchronize the output data to the received clock signal; wherein the synchronization circuit is configured to synchronize the output data to the received clock signal such that the output data is output from a data output of the memory device synchronized to the received clock signal.

8. The memory device of claim 7, wherein the clock port is configured to receive the clock signal from a memory controller and to forward the clock signal received back to the memory controller.

9. The memory device of claim 8, wherein the synchronization circuit is configured to synchronize the output data to the forwarded clock signal such that the output data is synchronous to the forwarded clock signal at a data input and the read clock input of the memory controller.

10. A memory system, comprising:
a plurality of memory devices, each memory device having a respective clock port and a respective data port;
a memory controller configured to control operation of the plurality of memory devices, the memory controller having a respective write clock output and a respective read clock input corresponding respectively to each memory device;
a respective first clock line extending from a respective write clock output of the memory controller to a respective clock port of the respective memory device to provide a clock signal to the respective memory device; and
a respective second clock line extending from the respective clock port of the respective memory device to the respective read clock input of the memory controller, wherein the clock signal provided to the respective clock port of the respective memory device is fed back to the respective read clock input of the memory controller.

11. The memory system of claim 10, further comprising:
a respective bidirectional data line bus extending between the memory device and the memory controller, wherein the respective bidirectional data line bus has a substantially same length as the respective second clock line.

12. The memory system of claim 11, wherein each memory device further includes a respective data input for receiving write data associated with the received clock signal, wherein the data input comprises an input buffer configured to latch in received write data.

13. The memory system of claim 10, further comprising:
a respective synchronization circuit, disposed in each memory device, configured to receive the clock signal from the memory controller and to synchronize output data at the respective data port to the clock signal being fed back to the memory controller.

14. The memory system of claim 13, wherein the memory system is a Double-Data-Rate (DDR) memory system.

15. The memory system of claim 14, wherein the plurality of memory devices are disposed on a memory module.

16. The memory system of claim 15, wherein the memory controller is connected to the plurality of memory devices through a memory module interface.

* * * * *